(12) United States Patent
Jo

(10) Patent No.: US 8,558,212 B2
(45) Date of Patent: Oct. 15, 2013

(54) CONDUCTIVE PATH IN SWITCHING MATERIAL IN A RESISTIVE RANDOM ACCESS MEMORY DEVICE AND CONTROL

(75) Inventor: Sung Hyun Jo, Sunnyvale, CA (US)

(73) Assignee: Crossbar, Inc., Santa Clara, CA (US)

( * ) Notice: Subject to any disclaimer, the term of this patent is extended or adjusted under 35 U.S.C. 154(b) by 100 days.

(21) Appl. No.: 12/894,098

(22) Filed: Sep. 29, 2010

(65) Prior Publication Data

US 2012/0074374 A1  Mar. 29, 2012

(51) Int. Cl.
*H01L 45/00* (2006.01)
*H01L 21/02* (2006.01)

(52) U.S. Cl.
USPC ............... 257/4; 257/E21.085; 257/E45.005; 438/382

(58) Field of Classification Search
None
See application file for complete search history.

(56) References Cited

U.S. PATENT DOCUMENTS

| | | | |
|---|---|---|---|
| 680,652 A | | 8/1901 | Elden |
| 4,433,468 A | | 2/1984 | Kawamata |
| 4,684,972 A | | 8/1987 | Owen et al. |
| 4,741,601 A | * | 5/1988 | Saito ........................ 349/49 |
| 5,242,855 A | | 9/1993 | Oguro |
| 5,278,085 A | | 1/1994 | Maddox, III et al. |
| 5,315,131 A | | 5/1994 | Kishimoto et al. |
| 5,335,219 A | | 8/1994 | Ovshinsky et al. |
| 5,360,981 A | | 11/1994 | Owen et al. |
| 5,457,649 A | | 10/1995 | Eichman et al. |
| 5,538,564 A | | 7/1996 | Kaschmitter |
| 5,541,869 A | | 7/1996 | Rose et al. |
| 5,594,363 A | | 1/1997 | Freeman et al. |
| 5,614,756 A | | 3/1997 | Forouhi et al. |
| 5,714,416 A | | 2/1998 | Eichman et al. |
| 5,751,012 A | | 5/1998 | Wolstenholme et al. |
| 5,840,608 A | | 11/1998 | Chang |
| 5,970,332 A | | 10/1999 | Pruijmboom et al. |
| 5,998,244 A | | 12/1999 | Wolstenholme et al. |
| 6,128,214 A | | 10/2000 | Kuekes et al. |
| 6,143,642 A | | 11/2000 | Sur, Jr. et al. |
| 6,259,116 B1 | | 7/2001 | Shannon |
| 6,291,836 B1 | | 9/2001 | Kramer et al. |

(Continued)

FOREIGN PATENT DOCUMENTS

| | | |
|---|---|---|
| KR | 1020110014248 A | 2/2011 |
| WO | WO 2009/005699 A1 | 1/2009 |

OTHER PUBLICATIONS

Sung Hyun Jo and Wei Lu, CMOS Compatible Nanoscale Nonvolatile Resistance Switching Memory Nano Letters vol. 8, No. 2 pp. 392-397 (2008).*

(Continued)

*Primary Examiner* — Thomas L Dickey
*Assistant Examiner* — Joseph Schoenholtz
(74) *Attorney, Agent, or Firm* — Ogawa P.C.

(57) ABSTRACT

A non-volatile memory device structure. The device structure includes a first electrode, a second electrode, a resistive switching material comprising an amorphous silicon material overlying the first electrode, and a thickness of dielectric material having a thickness ranging from 5 nm to 10 nm disposed between the second electrode and the resistive switching layer. The thickness of dielectric material is configured to electrically breakdown in a region upon application of an electroforming voltage to the second electrode. The electrical breakdown allows for a metal region having a dimension of less than about 10 nm by 10 nm to form in a portion of the resistive switching material.

20 Claims, 10 Drawing Sheets

(56) References Cited

U.S. PATENT DOCUMENTS

| | | |
|---|---|---|
| 6,436,765 B1 | 8/2002 | Liou et al. |
| 6,436,818 B1 | 8/2002 | Hu et al. |
| 6,492,694 B2 | 12/2002 | Noble et al. |
| 6,768,157 B2 | 7/2004 | Krieger et al. |
| 6,815,286 B2 | 11/2004 | Krieger et al. |
| 6,838,720 B2 | 1/2005 | Krieger et al. |
| 6,858,481 B2 | 2/2005 | Krieger et al. |
| 6,858,482 B2 | 2/2005 | Gilton |
| 6,864,127 B2 | 3/2005 | Yamazaki et al. |
| 6,864,522 B2 | 3/2005 | Krieger et al. |
| 6,927,430 B2 | 8/2005 | Hsu |
| 6,939,787 B2 | 9/2005 | Ohtake et al. |
| 6,946,719 B2 | 9/2005 | Petti et al. |
| 7,020,006 B2 | 3/2006 | Chevallier et al. |
| 7,023,093 B2 | 4/2006 | Canaperi et al. |
| 7,026,702 B2 | 4/2006 | Krieger et al. |
| 7,102,150 B2 | 9/2006 | Harshfield et al. |
| 7,122,853 B1 | 10/2006 | Gaun et al. |
| 7,187,577 B1 | 3/2007 | Wang et al. |
| 7,221,599 B1 | 5/2007 | Gaun et al. |
| 7,238,607 B2 | 7/2007 | Dunton et al. |
| 7,254,053 B2 | 8/2007 | Krieger et al. |
| 7,289,353 B2 | 10/2007 | Spitzer et al. |
| 7,365,411 B2 | 4/2008 | Campbell |
| 7,405,418 B2 | 7/2008 | Happ et al. |
| 7,426,128 B2 | 9/2008 | Scheuerlein |
| 7,433,253 B2 | 10/2008 | Gogl et al. |
| 7,474,000 B2 | 1/2009 | Scheuerlein et al. |
| 7,479,650 B2 | 1/2009 | Gilton |
| 7,521,705 B2 * | 4/2009 | Liu .................... 257/2 |
| 7,534,625 B2 | 5/2009 | Karpov et al. |
| 7,550,380 B2 | 6/2009 | Elkins et al. |
| 7,606,059 B2 * | 10/2009 | Toda ................. 365/148 |
| 7,615,439 B1 | 11/2009 | Schricker et al. |
| 7,728,318 B2 | 6/2010 | Raghuram et al. |
| 7,729,158 B2 | 6/2010 | Toda et al. |
| 7,772,581 B2 | 8/2010 | Lung |
| 7,778,063 B2 | 8/2010 | Brubaker et al. |
| 7,786,464 B2 | 8/2010 | Nirschl et al. |
| 7,786,589 B2 | 8/2010 | Matsunaga et al. |
| 7,824,956 B2 | 11/2010 | Schricker et al. |
| 7,829,875 B2 | 11/2010 | Scheuerlein |
| 7,835,170 B2 | 11/2010 | Bertin et al. |
| 7,859,884 B2 | 12/2010 | Scheuerlein |
| 7,875,871 B2 | 1/2011 | Kumar et al. |
| 7,881,097 B2 | 2/2011 | Hosomi et al. |
| 7,897,953 B2 | 3/2011 | Liu |
| 7,898,838 B2 | 3/2011 | Chen et al. |
| 7,920,412 B2 | 4/2011 | Hosotani et al. |
| 7,924,138 B2 | 4/2011 | Kinoshita et al. |
| 7,968,419 B2 | 6/2011 | Li et al. |
| 8,004,882 B2 | 8/2011 | Katti et al. |
| 8,018,760 B2 | 9/2011 | Muraoka et al. |
| 8,045,364 B2 | 10/2011 | Schloss et al. |
| 8,054,674 B2 * | 11/2011 | Tamai et al. .......... 365/148 |
| 8,067,815 B2 | 11/2011 | Chien et al. |
| 8,071,972 B2 * | 12/2011 | Lu et al. ............. 257/5 |
| 8,088,688 B1 | 1/2012 | Herner |
| 8,097,874 B2 | 1/2012 | Venkatasamy et al. |
| 8,102,698 B2 | 1/2012 | Scheuerlein |
| 8,143,092 B2 | 3/2012 | Kumar et al. |
| 8,144,498 B2 | 3/2012 | Kumar et al. |
| 8,164,948 B2 | 4/2012 | Katti et al. |
| 8,168,506 B2 | 5/2012 | Herner |
| 8,183,553 B2 | 5/2012 | Phatak et al. |
| 8,207,064 B2 | 6/2012 | Bandyopadhyay et al. |
| 8,227,787 B2 | 7/2012 | Kumar et al. |
| 8,233,308 B2 | 7/2012 | Schricker et al. |
| 8,237,146 B2 | 8/2012 | Kreupl et al. |
| 8,394,670 B2 | 3/2013 | Herner |
| 2004/0026682 A1 | 2/2004 | Jiang |
| 2005/0020510 A1 | 1/2005 | Benedict |
| 2005/0029587 A1 | 2/2005 | Harshfield |
| 2007/0008773 A1 | 1/2007 | Scheuerlein |
| 2007/0015348 A1 * | 1/2007 | Hsu et al. ............. 438/570 |
| 2007/0087508 A1 | 4/2007 | Herner |
| 2007/0105284 A1 | 5/2007 | Herner |
| 2007/0105390 A1 | 5/2007 | Oh |
| 2007/0205510 A1 | 9/2007 | Lavoie et al. |
| 2007/0290186 A1 | 12/2007 | Bourim et al. |
| 2008/0002481 A1 | 1/2008 | Gogl et al. |
| 2008/0006907 A1 | 1/2008 | Lee et al. |
| 2008/0048164 A1 | 2/2008 | Odagawa |
| 2008/0089110 A1 | 4/2008 | Robinett et al. |
| 2008/0090337 A1 | 4/2008 | Williams |
| 2008/0106925 A1 | 5/2008 | Paz De Araujo et al. |
| 2008/0106926 A1 | 5/2008 | Brubaker et al. |
| 2008/0206931 A1 | 8/2008 | Breuil et al. |
| 2009/0001345 A1 | 1/2009 | Schricker et al. |
| 2009/0014707 A1 * | 1/2009 | Lu et al. .............. 257/4 |
| 2009/0052226 A1 | 2/2009 | Lee et al. |
| 2009/0168486 A1 | 7/2009 | Kumar |
| 2009/0231910 A1 | 9/2009 | Liu et al. |
| 2009/0250787 A1 | 10/2009 | Kutsunai |
| 2009/0256130 A1 | 10/2009 | Schricker |
| 2009/0257265 A1 | 10/2009 | Chen et al. |
| 2009/0298224 A1 | 12/2009 | Lowrey |
| 2009/0321789 A1 | 12/2009 | Wang et al. |
| 2010/0012914 A1 | 1/2010 | Xu et al. |
| 2010/0019310 A1 | 1/2010 | Sakamoto |
| 2010/0032638 A1 | 2/2010 | Xu |
| 2010/0084625 A1 | 4/2010 | Wicker et al. |
| 2010/0085798 A1 | 4/2010 | Lu et al. |
| 2010/0090192 A1 | 4/2010 | Goux et al. |
| 2010/0101290 A1 | 4/2010 | Bertolotto |
| 2010/0102290 A1 | 4/2010 | Lu et al. |
| 2010/0157651 A1 | 6/2010 | Kumar et al. |
| 2010/0157710 A1 | 6/2010 | Lambertson et al. |
| 2010/0176368 A1 | 7/2010 | Ko et al. |
| 2010/0219510 A1 | 9/2010 | Scheuerlein et al. |
| 2010/0321095 A1 | 12/2010 | Mikawa et al. |
| 2011/0133149 A1 | 6/2011 | Sonehara |
| 2011/0155991 A1 | 6/2011 | Chen |
| 2011/0198557 A1 | 8/2011 | Rajendran et al. |
| 2011/0212616 A1 | 9/2011 | Seidel et al. |
| 2011/0227028 A1 | 9/2011 | Sekar et al. |
| 2011/0284814 A1 | 11/2011 | Zhang |
| 2011/0317470 A1 | 12/2011 | Lu et al. |
| 2012/0008366 A1 | 1/2012 | Lu |
| 2012/0012806 A1 | 1/2012 | Herner |
| 2012/0015506 A1 | 1/2012 | Jo et al. |
| 2012/0025161 A1 | 2/2012 | Rathor et al. |
| 2012/0033479 A1 | 2/2012 | Delucca et al. |
| 2012/0043519 A1 | 2/2012 | Jo et al. |
| 2012/0043654 A1 | 2/2012 | Lu et al. |
| 2012/0104351 A1 | 5/2012 | Wei et al. |
| 2012/0145984 A1 | 6/2012 | Rabkin et al. |
| 2012/0155146 A1 | 6/2012 | Ueda et al. |
| 2012/0235112 A1 | 9/2012 | Huo et al. |

OTHER PUBLICATIONS

D. A. Muller, T. Sorsch, S. Moccio, F. H. Baumann, K. Evans-Lutterodt and G. Timp, The Electronic Structure at the Atomic Scale of Ultrathin Gate Oxides, Nature, vol. 399, No. 24, pp. 758-761 Jun. 1998.*

Suñé, J., E. Farrés, I. Placencia, N. Barniol, F. Martin, and X. Aymerich. "Nondestructive Multiple Breakdown Events in Very Thin SiO2 Films." Applied Physics Letters 55.2 (1989).*

Avila, A., and R. Asomoza. "Switching in Coplanar Amorphous Hydrogenated Silicon Devices." Solid State Electronics 44 (2000): 17-27.*

Herve Marand, ME Sc 5025, Chapter 7, University of Vermont. downloaded from the URL < http://www.files.chem.vt.edu/chem-dept/marand/MEScchap6-1c.pdf>.*

Owen, A.E., Hu, J. Hajto, J. Snell, A.J., "Electronic switching in amorphouse silicon devices: properties of the conducting filament", Solid-State and Integrated Circuit Technology, 1998, Proceedings of the 5th Internation Conference on, pp. 830-833.*

Jo, Sung Hyun. Nanoscale Memristive Devices for Memory and Logic Applications. Thesis. University of Michigan, 2010.*

Office Action for U.S. Appl. No. 12/861,650 dated Oct. 16, 2012.

(56) References Cited

OTHER PUBLICATIONS

Notice of Allowance for U.S. Appl. No. 12/894,087 dated Oct. 25, 2012.
Notice of Allowance for U.S. Appl. No. 13/149,807 dated Oct. 29, 2012.
Notice of Allowance for U.S. Appl. No. 12/861,666 dated Nov. 14, 2012.
Office Action for U.S. Appl. No. 13/156,232, dated Nov. 26, 2012.
Notice of Allowance for U.S. Appl. No. 13/290,024 dated Nov. 28, 2012.
Notice of Allowance for U.S. Appl. No. 12/814,410 dated Jan. 8, 2013.
Office Action for U.S. Appl. No. 13/417,135 dated Oct. 9, 2012.
Notice of Allowance for U.S. Appl. No. 13/532,019 dated Nov. 14, 2012.
Office Action for U.S. Appl. No. 13/149,653 dated Nov. 20, 2012.
Office Action of U.S. Appl. No. 13/436,714 dated Dec. 7, 2012.
Corrected Notice of Allowance for U.S. Appl. No. 12/861,666 dated Jan. 11, 2013.
Supplemental Notice of Allowance for U.S. Appl. No. 12/894,087 dated Jan. 11, 2013.
Jian Hu et al., "Area-Dependent Switching in Thin Film-Silicon Devices", Materials Research Society, Mal. Res. Soc. Symp Proc., 2003, pp. A18.3.1-A18.3.6, vol. 762.
André Dehon, "Array-Based Architecture for FET-Based, Nanoscale Electronics", IEEE Transactions on Nanotechnology, Mar. 2003, pp. 23-32, vol. 2, No. 1, IEEE.
Herb Goronkin et al., "High-Performance Emerging Solid-State Memory Technologies", MRS Bulletin, www.mrs.org/publications/bulletin, Nov. 2004, pp. 805-813.
Gerhard Müller et al., "Status and Outlook of Emerging Nonvolatile Memory Technologies", IEEE, 2004, pp. 567-570.
A.E. Owen et al., "Memory Switching in Amorphous Silicon Devices", Journal of Non-Crystalline Solids 59 & 60, 1983, pp. 1273-1280, North Holland Publishing Company/Physical Society of Japan.
J. Campbell Scott, "Is There an Immortal Memory?", www.sciencemag.org, Apr. 2, 2004, pp. 62-63, vol. 304 No. 5667, American Association for the Advancement of Science.
S.H. Lee et al., "Full Integration and Cell Characteristics For 64Mb Nonvolatile PRAM", 2004 Symposium on VLSI Technology Digest of Technical Papers, IEEE, 2004, pp. 20-21.
Stephen Y. Chou et al., "Imprint Lithography With 25-Nanometer Resolution", Science, Apr. 5, 1996, pp. 85-87, vol. 272, American Association for the Advancement of Science.
S. Zankovych et al., "Nanoimprint Lithography: challenges and prospects", Nanotechnology, 2001, pp. 91-95, vol. 12, Institutue of Physics Publishing.
Jian Hu et al., "Switching and filament formation in hot-wire CVD p-type a-Si:H devices", Thin Solid Films, Science Direct, www.sciencedirect.com, 2003, pp. 249-252, vol. 430, Elsevier Science B.V.
S. Hudgens et al., "Overview of Phase-Change Chalcogenide Nonvolatile Memory Technology", MRS Bulletin, www.mrs.org/publications/bulletin, Nov. 2004, pp. 829-832.
K. Terabe et al., "Quantized conductance atomic switch", Nature, www.nature.com/nature, Jan. 6, 2005, pp. 47-50, vol. 433, Nature Publishing Group.
Michael Kund et al., "Conductive bridging RAM (CBRAM): An emerging non-volatile memory technology scalable to sub 20nm", IEEE, 2005.
W. Den Boer, "Threshold switching in hydrogenated amorphous silicon", Appl. Phys. Letter, 1982, pp. 812-813, vol. 40, American Institute of Physics.
P.G. Lecomber et al., "The Switching Mechanism in Amorphous Silicon Junctions", Journal of Non-Crystalline Solids, 1985, pp. 1373-1382, vol. 77 & 78, Elsevier Science Publishers B.V., North Holland Physics Publishing Division, North-Holland, Amsterdam.
A. E. Owen et al., "Switching in amorphous devices", INT. J. Electronics, 1992, pp. 897-906, vol. 73, No. 5, Taylor and Francis Ltd.
M. Jafar et al., "Switching in amorphous-silicon devices", Physical Review B, May 15, 1994, pp. 611-615, vol. 49, No. 19, The American Physical Society.
Alexandra Stikeman, "Polymer Memory—The plastic path to better data storage", Technology Review, www.technologyreview.com, Sep. 2002, pp. 31.
Yong Chen et al., "Nanoscale molecular-switch crossbar circuits", Nanotechnology, 2003, pp. 462-468, vol. 14, Institute of Physics Publishing Ltd.
C. P. Collier et al., "Electronically Configurable Molecular-Based Logic Gates", Science Jul. 16, 1999, pp. 391-395, vol. 285, No. 5426, American Association for the Advancement of Science.
Office Action for U.S. Appl. No. 11/187,541 dated Jul. 22, 2010.
Office Action for U.S. Appl. No. 11/875,541 dated Mar. 30, 2011.
Office Action for U.S. Appl. No. 11/875,541 dated Oct. 5, 2011.
Office Action for U.S. Appl. No. 11/875,541 dated Jun. 8, 2012.
Jang Wook Choi, "Bistable [2]Rotaxane Based Molecular Electronics: Fundamentals and Applications", Dissertation, Chapter 3, <http://resolver.caltech.edu/CaltechETD:etd-05242007-194737> 2007, pp. 79-120, California Institute of Technology, Pasadena.
Sung-Hyun Jo et al., "A Silicon-Based Crossbar Ultra-High-Density Non-Volatile Memory", SSEL Annual Report 2007.
International Search Report for PCT/US2009/060023 filed on Oct. 8, 2009.
Rainer Waser et al., "Nanoionics-based resistive switching memories", Nature Materials, Nov. 2007, pp. 833-835, vol. 6, Nature Publishing Group.
Written Opinion of the International Searching Authority for PCT/US2009/060023 filed on Oct. 8, 2009.
Ex parte Quayle Action for U.S. Appl. No. 12/826,653 dated May 8, 2012.
International Search Report for PCT/US2011/040090 filed on Jun. 10, 2011.
Written Opinion of the International Searching Authority for PCT/US2011/040090 filed on Jun. 10, 2011.
Notice of Allowance for U.S. Appl. No. 13/158,231 dated Apr. 17, 2012.
Office Action for U.S. Appl. No. 12/835,704 dated Sep. 21, 2011.
Office Action for U.S. Appl. No. 12/835,704 dated Mar. 1, 2012.
Advisory Action for U.S. Appl. No. 12/835,704 dated Jun. 8, 2012.
International Search Report and Written Opinion for PCT/US2011/046035 filed on Jul. 29, 2011.
Office Action for U.S. Appl. No. 12/861,650 dated Jan. 25, 2012.
Notice of Allowance for U.S. Appl. No. 12/861,650 dated Jun. 19, 2012.
Sung Hyun Jo et al., "Programmable Resistance Switching in Nanoscale Two-Terminal Devices," Supporting Information, pp. 1-4.
Kuk-Hwan Kim et al., "Nanoscale resistive memory with intrinsic diode characteristics and long endurance," Applied Physics Letters, 2010, pp. 053106-1-053106-3, vol. 96, American Institute of Physics.
Sung Hyun Jo et al., "Si-Based TwoTerminal Resistive Switching Nonvolatile Memory", IEEE, 2008.
Sung Hyun Jo et al., "Nanoscale Memristor Device as Synapse in Neuromorphic Systems", Nano Letters, pubs.acs.org/NanoLett, pp. A-E, American Chemical Society Publications.
Wei Lu et al., "Nanoelectronics from the bottom up", Nature Materials, www.nature.com/naturematerials, Nov. 2007, pp. 841-850, vol. 6, Nature Publishing Group.
Sung Hyun Jo et al., "Ag/a-Si:H/c-Si Resistive Switching Nonvolatile Memory Devices", Nanotechnology Materials and Devices Conference, IEEE, 2006, pp. 116-117, vol. 1.
Sung Hyun Jo et al., "Experimental, Modeling and Simulation Studies of Nanoscale Resistance Switching Devices", $9^{th}$ Conference on Nanotechnology, IEEE, 2009, pp. 493-495.
Sung Hyun Jo et al., "Nonvolatile Resistive Switching Devices Based on Nanoscale Metal/Amorphous Silicon/Crystalline Silicon Junctions", Mater. Res. Soc. Symp. Proc., 2007, vol. 997, Materials Research Society.
Sung Hyun Jo et al., "Si Memristive Devices Applied to Memory and Neuromorphic Circuits", Proceedings of 2010 IEEE International Symposium on Circuits and Systems, 2010, pp. 13-16.
Wei Lu et al., "Supporting Information", 2008.

(56) References Cited

OTHER PUBLICATIONS

Sung Hyun Jo et al., "High-Density Crossbar Arrays Based on a Si Memristive System", Nano Letters, 2009, pp. 870-874, vol. 9 No. 2, American Chemical Society Publications.
Sung Hyun Jo et al., "High-Density Crossbar Arrays Based on a Si Memristive System", Supporting Information, 2009, pp. 1-4.
Sung Hyun Jo et al., "Programmable Resistance Switching in Nanoscale Two-Terminal Devices", Nano Letters, 2009, pp. 496-500, vol. 9 No. 1, American Chemical Society Publications.
Shubhra Gangopadhyay et al., "Memory Switching in Sputtered Hydrogenated Amorphous Silicon (a-Si:H)", Japanese Journal of Applied Physics, Short Notes, 1985, pp. 1363-1364, vol. 24 No. 10.
S. K. Dey, "Electrothermal model of switching in amorphous silicon films", J. Vac. Sci. Technol., Jan./Feb. 1980, pp. 445-448, vol. 17, No. 1, American Vaccum Society.
J. Hajto et al., "The Programmability of Amorphous Silicon Analogue Memory Elements", Mat. Res. Soc. Symp. Proc., 1990, pp. 405-410, vol. 192, Materials Research Society.
M. J. Rose et al., "Amorphous Silicon Analogue Memory Devices", Journal of Non-Crystalline Solids, 1989, pp. 168-170, vol. 115, Elsevier Science Publishers B.V., North-Holland.
A. Moopenn et al., "Programmable Synaptic Devices For Electronic Neural Nets", Control and Computers, 1990, pp. 37-41, vol. 18 No. 2.
P.G. Le Comber, "Present and Future Applications of Amorphous Silicon and Its Alloys", Journal of Non-Crystalline Solids, 1989, pp. 1-13, vol. 115, Elsevier Science Publishers B.V., North Holland.
J. Hu, et al., "AC Characteristics of Cr/p$^+$a-Si:H/V Analog Switching Devices", IEEE Transactions on Electron Devices, Sep. 2000, pp. 1751-1757, vol. 47 No. 9, IEEE.
A.E. Owen et al., "New amorphous-silicon electrically programmable nonvolatile switching device", Solid-State and Electron Devices, IEEE Proceedings, Apr. 1982, pp. 51-54, vol. 129, Pt. I., No. 2.
J. Hajto et al., "Electronic Switching in Amorphous-Semiconductor Thin Films", Chapter 14, pp. 640-701.
J. Hajto et al., "Analogue memory and ballistic electron effects in metal-amorphous silicon structures", Philosophical Magazine B, 1991, pp. 349-369, vol. 63 No. 1, Taylor & Francis Ltd.
A. J. Holmes et al., "Design of Analogue Synapse Circuits using Non-Volatile a-Si:H Memory Devices", pp. 351-354.
Yajie Dong et al., "Si/a-Si Core/Shell Nanowires as Nonvolatile Crossbar Switches", Nano Letters, Jan. 2008, pp. 386-391, vol. 8 No. 2, American Chemical Society.
European Search Report for Application No. EP 09 81 9890.6 of Mar. 27, 2012.
D. A. Muller et al., "The Electronic structure at the atomic scale of ultrathin gate oxides", Nature, Jun. 24, 1999, pp. 758-761, vol. 399.
J. Suñé et al., "Nondestructive multiple breakdown events in very thin $SiO_2$ films", Applied Physics Letters, 1989, pp. 128-130, vol. 55.
Herve Marand et al., MESc. 5025 lecture notes: Chapter 7. Diffusion, University of Vermont, http://www.files.chem.vt.edu/chem-dept/marand/MEScchap6-1c.pdf.
A. E. Owen et al., "Electronic Switching in Amorphous Silicon Devices: Properties of the Conducting Filament", Proceedings of 5th International Conference on Solid-State and Integrated Circuit Technology, IEEE, 1998, pp. 830-833.
Office Action for U.S. Appl. No. 12/582,086 dated Apr. 19, 2011.
Office Action for U.S. Appl. No. 12/582,086 dated Sep. 6, 2011.
Notice of Allowance for U.S. Appl. No. 12/582,086 dated Oct. 21, 2011.
International Search Report for PCT/US2009/061249 filed on Oct. 20, 2009.
Written Opinion of the International Searching Authority for PCT/US2009/061249 filed on Oct. 20, 2009.
Office Action for U.S. Appl. No. 12/814,410 dated Apr. 17, 2012.
Office Action for U.S. Appl. No. 12/835,699 dated Aug. 24, 2011.
Notice of Allowance for U.S. Appl. No. 12/835,699 dated Feb. 6, 2012.
Office Action for U.S. Appl. No. 12/833,898 dated Apr. 5, 2012.
European Search Report for Application No. EP 1100 5207.3 of Oct. 12, 2011.
Notice of Allowance for U.S. Appl. No. 12/833,898 dated May 30, 2012.
Notice of Allowance for U.S. Appl. No. 12/939,824 dated May 11, 2012.
Notice of Allowance for U.S. Appl. No. 12/940,920 dated Oct. 5, 2011.
Office Action for U.S. Appl. No. 13/314,513 dated Mar. 27, 2012.
Shong Yin, "Solution Processed Silver Sulfide Thin Films for Filament Memory Applications", Technical Report No. UCB/EECS-2010-166, http://www.eecs.berkeley.edu/Pubs/TechRpts/2010/EECS-2010-166.html, Dec. 17, 2010, Electrical Engineering and Computer Sciences, University of California at Berkeley.
Office Action for U.S. Appl. No. 13/149,653 dated Apr. 25, 2012.
International Search Report for PCT/US2011/045124 filed on Jul. 22, 2011.
Written Opinion of the International Searching Authority for PCT/US2011/045124 filed on Jul. 22, 2011.
Peng-Heng Chang et al., "Aluminum spiking at contact windows in Al/Ti-W/Si", Appl. Phys. Lett., Jan. 25, 1988, pp. 272-274, vol. 52 No. 4, American Institute of Physics.
J. Del Alamo et al., "Operating Limits of Al-Alloyed High-Low Junctions for BSF Solar Cells", Solid State Electronics, 1981, pp. 415-420, vol. 24, Pergamon Press Ltd., Great Britain.
Hao-Chih Yuan et al., "Silicon Solar Cells with Front Hetero-Contact and Aluminum Alloy Back Junction", NREL Conference Paper CP-520-42566, 33rd IEEE Photovoltaic Specialists Conference, May 11-16, 2008, National Renewable Energy Laboratory, San Diego, California.
Notice of Allowance for U.S. Appl. No. 12/939,824 dated Jul. 24, 2012.
Office Action for Application No EP 1100 5207.3 dated Aug. 8, 2012.
Notice of Allowance for U.S. Appl. No. 13/314,513, dated Jan. 24, 2013.
Notice of Allowance for U.S. Appl. No. 13/118,258, dated Feb. 6, 2013.
International Search Report and Written Opinion for PCT/US2012/040242, filed May 31, 2012.
Office Action for U.S. Appl. No. 13/174,264, dated Mar. 6, 2013.
Office Action for U.S. Appl. No. 13/679,976, dated Mar. 6, 2013.
Office Action for U.S. Appl. No. 13/465,188, dated Mar. 19, 2013.
Office Action for U.S. Appl. No. 12/861,432, dated Mar. 29, 2013.
Notice of Allowance for U.S. Appl. No. 13/748,490, dated Apr. 9, 2013.

* cited by examiner

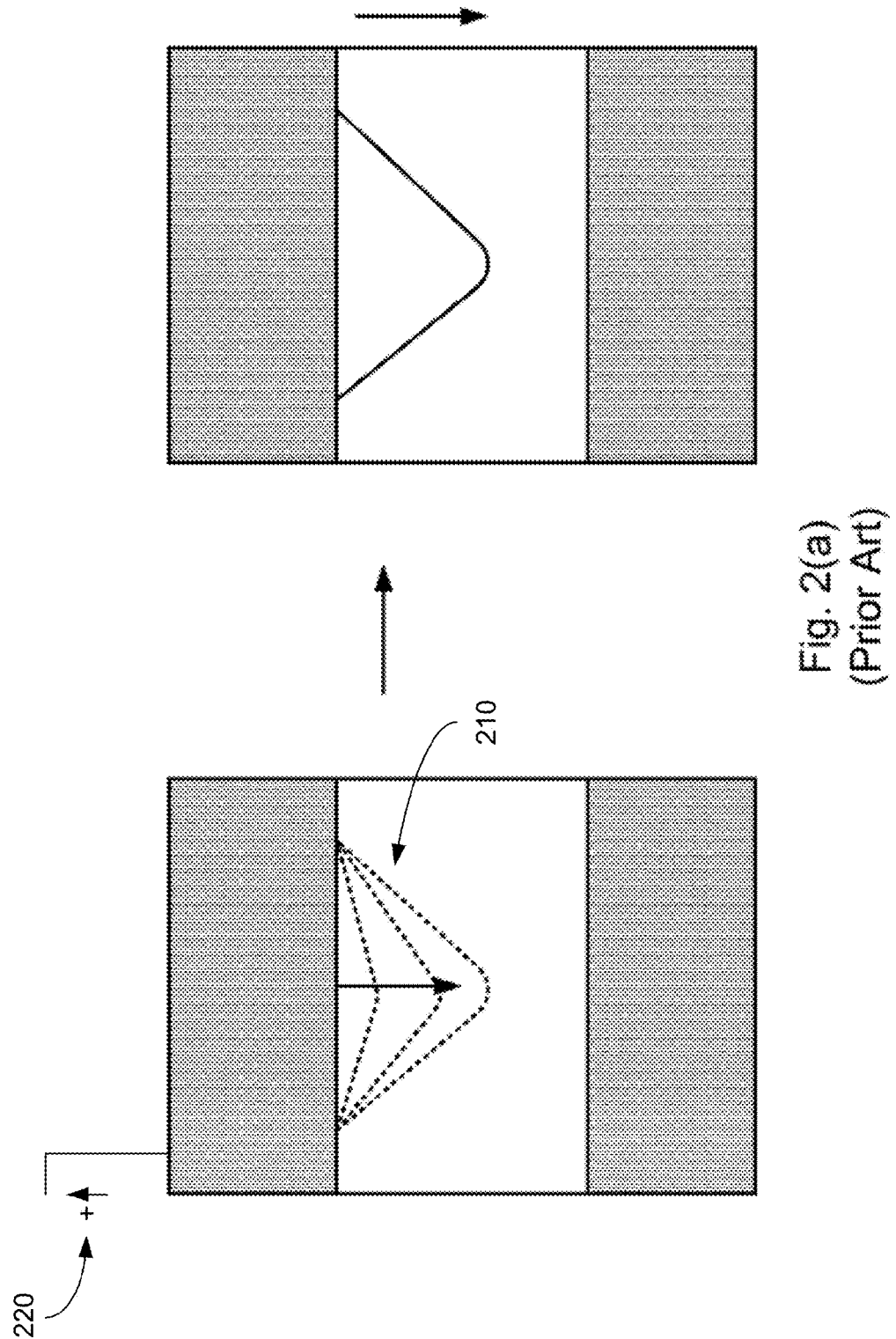

CONDUCTIVE PATH IN SWITCHING MATERIAL IN A RESISTIVE RANDOM ACCESS MEMORY DEVICE AND CONTROL

CROSS REFERENCE TO RELATED APPLICATIONS

Not Applicable

STATEMENT RELATED TO GOVERNMENT OR FEDERAL SPONSORED RESEARCH

Not Applicable

BACKGROUND

The present invention is related to switching devices. More particularly, the present invention is provides a resistive switching device characterized by a reduced forming voltage and a low leakage current. Embodiments of the present invention have been applied to fabrication and operation of a resistive random access memory device. But it should be recognized that the present invention can have a much broader range of applicability.

The success of semiconductor devices has been mainly driven by an intensive transistor down-scaling process. However, as field effect transistors (FET) approach sizes less than 100 nm, problems such as short channel effect can degrade device performance. Moreover, such sub 100 nm device size can lead to sub-threshold slope non-scaling and also increases power dissipation. It is generally believed that transistor-based memories such as those commonly known as Flash may approach an end to scaling within a decade. Flash memory is one type of non-volatile memory device.

Other non-volatile random access memory devices such as ferroelectric RAM (Fe RAM), magneto-resistive RAM (MRAM), organic RAM (ORAM), and phase change RAM (PCRAM), among others, have been explored as next generation memory devices. These devices often require new materials and device structures to couple with silicon-based devices to form a memory cell, which lack one or more key attributes. For example, Fe-RAM and MRAM devices have fast switching characteristics and good programming endurance, but their fabrication is not CMOS compatible and size is usually large. Switching for a PCRAM device requires large amounts of power. Organic RAM or ORAM is incompatible with large volume silicon-based fabrication and device reliability is usually poor.

From the above, a new semiconductor device structure and integration is desirable.

BRIEF SUMMARY OF THE PRESENT INVENTION

The present invention is related to switching devices. More particularly, the present invention is provides a resistive switching device characterized by a low forming voltage and a low leakage current. Embodiments of the present invention have been applied to fabrication and operation of a resistive random access memory (RRAM) device. But it should be recognized that the present invention can have a much broader range of applicability.

In a specific embodiment, a resistive switching device is provided. The resistive switching device includes a first electrode, a switching material, and a second electrode. In a specific embodiment, the resistive switching device includes a thickness of dielectric material disposed between the second electrode and the switching material. The thickness of dielectric material is configured to electrically breakdown in a region and cause formation of an open region in a portion of the thickness of dielectric material when a first voltage is applied to the second electrode. The open region has a first dimension to allow a metal region to form from the metal material within the portion of the thickness of dielectric material. The metal region further extends into a portion of the resistive switching material in a vicinity of the second electrode. The first voltage is a positive biased voltage in a specific embodiment. The metal region is characterized by a first dimension. The first dimension is less than a second dimension. The second dimension is a dimension of a second metal region formed in the resistive switching material upon application of the first voltage in the absence of the thickness of dielectric material. In a specific embodiment, the first dimension is less than about 10 nm. In a preferred embodiment, the thickness of dielectric material is characterized by a thickness less than about 5 nm.

In a specific embodiment, a method of forming a non-volatile memory device is provided. The method includes providing a semiconductor substrate having a surface region. A first dielectric material is formed overlying the surface region of the semiconductor substrate. The method includes forming a first electrode structure overlying the dielectric material and forming a resistive switching material comprising an amorphous silicon material overlying the first electrode. A second electrode comprising a metal material is formed overlying the resistive switching material. In a specific embodiment the method includes forming a thickness of second dielectric material disposed between the second electrode and the resistive switching layer. The thickness of second dielectric material is configured to electrically breakdown in a localized region upon application of a first voltage to the second electrode. The localized breakdown forms an opening region in a portion of the thickness of second dielectric material to cause a first metal region to form in the portion of the thickness of second dielectric material and in a vicinity of the second electrode from the metal material in a portion of the resistive switching material. The opening region has a first dimension no greater than about 10 nm.

Many benefits can be achieved by ways of the present invention over convention techniques. The present invention allows a metal region formed in the resistive switching material having a reduced cross sectional area. The reduced cross sectional area allows for an reduction of forming voltage, and a reduction in off-state leakage current. Additionally, a thinner metal material can be used to facilitate etching of the metal material. Depending on the embodiment, one or more of these benefits can be achieved. One skilled in the art would recognize other variations, modifications, and alternatives.

DETAILED DESCRIPTION OF THE PRESENT INVENTION

The present invention is related to switching devices. More particularly, the present invention provides a resistive switching device characterized by a well controlled electroforming process and a low leakage current. Embodiments of the present invention have been applied to fabrication and operation of a resistive random access memory device. But it should be recognized that the present invention can have a much broader range of applicability.

Due to the explosive growth in consumer devices, there is an ever increasing demand for memory device density. Data storage of current non-volatile memory devices are based on charges stored in a floating gate or a dielectric layer. Scaling of these devices is limited as these devices usually require a transistor device coupled to a memory cell. Further down scale of transistors may not be possible due to short channel effects and others.

Resistive switching in an amorphous silicon based resistive random access memory (RRAM) is enabled by a conductive path caused by metal particles formed from a metal electrode in the amorphous silicon material. The conduction path includes a metal region and a filament structure. The metal region is formed when an electroforming voltage is applied to the one of the electrodes of an as-fabricated device. The formation of the metal region is mainly dependent on metal diffusion from an electrode into the switching material. The metal region has a size that depends at least on a contact area between the electrode and the switching element. The filament structure is allowed to extend or contract depending on polarity of an operating voltage applied. The length of the filament structure is primarily depending on an electric field as a result of the applied operating voltage and is independent of the contact region between the electrode and the switching material. Device failure can often occur due to excessive extension of the metal region by diffusion, which is not controllable. To prevent such failure, metal material diffusion after electroforming needs to be suppressed and device operation (read, write, or erase) should be carried out by control of the electric field, or by the respective operating voltage.

Embodiments according to the present invention provide a method and device structure to control the metal region and the filament structure for writing, for reading, and for erasing by providing a controlled conductive path in the switching material from the metal particles. The resulting device has a desirable endurance characteristic for repeated cycling. One skilled in the art would recognize other variations, modifications, and alternatives.

Figure 1:
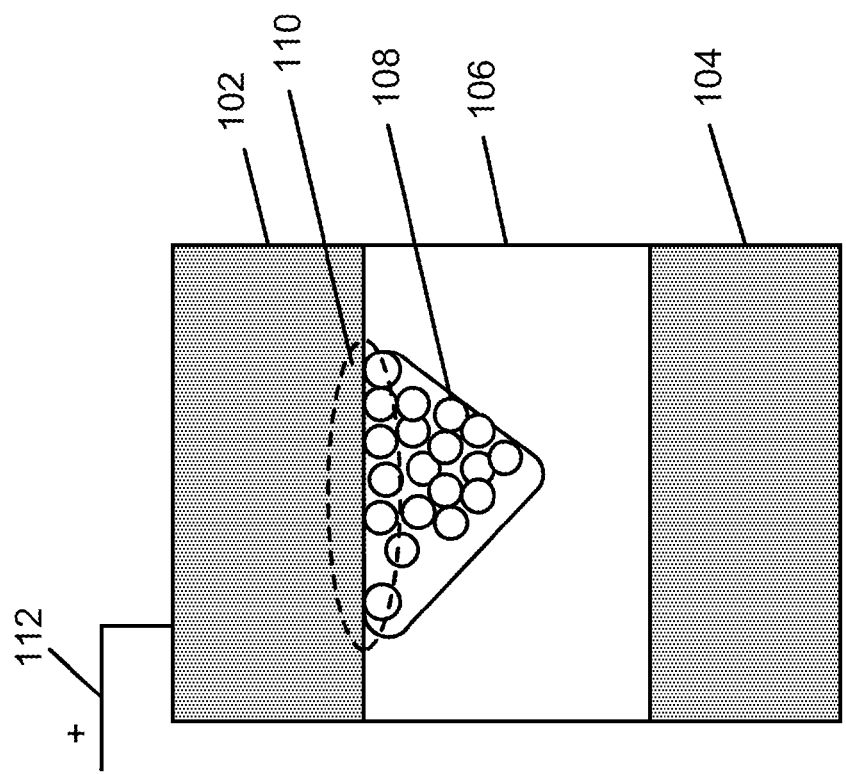

FIG. 1 is a simplified diagram illustrating a conventional switching device structure 100. As shown, the convention switching device includes a top electrode 102, a bottom electrode 104, and a switching material 106 sandwiched between the top electrode and the bottom electrode. The top electrode can have a portion that includes a metal material. For the switching element using an amorphous silicon material, the metal material can be silver, platinum, palladium, or other suitable metal materials having a suitable diffusivity characteristic in the amorphous silicon material. As shown, upon application of an electroforming voltage 112, a metal region 108 is formed in the switching material and in contact with the top electrode. The metal region is formed largely by a diffusion mechanism, assisted by an electric field resulting from the electroforming voltage. As shown, the metal region and has a contact area 110 about the same as the top electrode.

Figure 2:
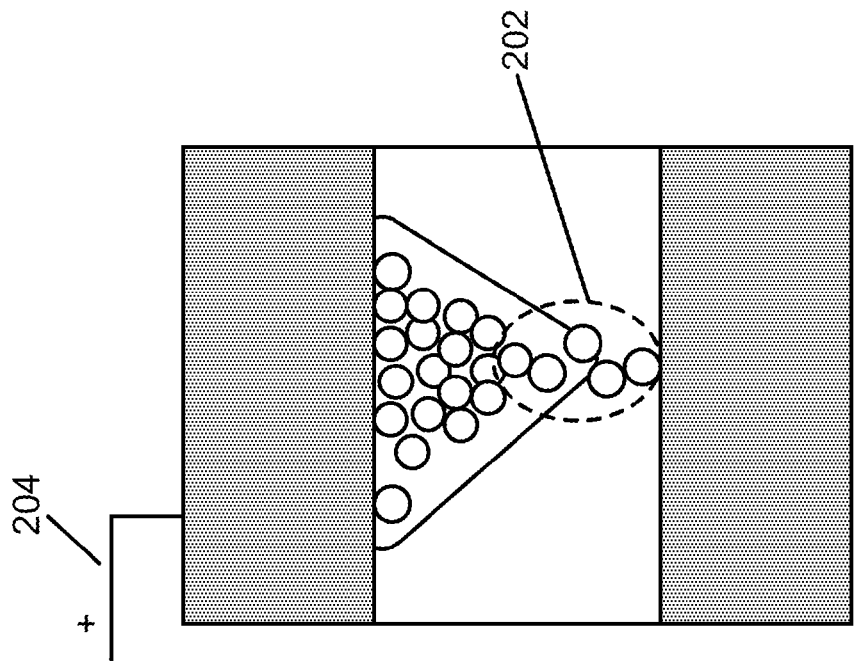
FIGS. 1 and 2 are simplified diagrams illustrating conduction path in a conventional resistive switching device.

FIG. 2 illustrates growth of the metal region in the switching material for the conventional resistive switching device. The diffusion of the metal material from the top electrode into the switching material is assisted by the electroforming voltage and results in a continuous metal region. As the metal region grows, an end region of the metal region becomes sharper and closer to the bottom electrode. Once the end region is sharp enough and close enough to the bottom electrode, the electric field would have a much greater effect on the metal region growth than diffusion. An illustration of the continuous growth of the metal region by diffusion is illustrated in FIG. 2(a). As in FIG. 2, a filament structure 202 is formed by hopping of a metal particle from a defect site to the next defect site in the amorphous silicon material upon application of a suitable voltage. Therefore formation of the filament structure is due to the presence of the electric filed and aided by diffusion in contrast to the metal region growth. The metal region including the filament structure form a conductive path for the switching device.

Referring again to FIG. 2, filament structure 202 is characterized by a length 210 that determines a resistance of the switching device. Ideally, the length 210 should extend or contract only upon application of an operating voltage 220 between a top electrode and bottom electrode, such as read, write, or erase. As diffusion of metal particles cannot be controlled, device failure occurs if the metal region continues to expand during cycling and eventually in contact with the bottom electrode. Therefore, suppression of diffusion of the metal particles is desirable after formation of the metal region so that the filament is controlled only by applied voltage 220 or electric field.

Figure 3:
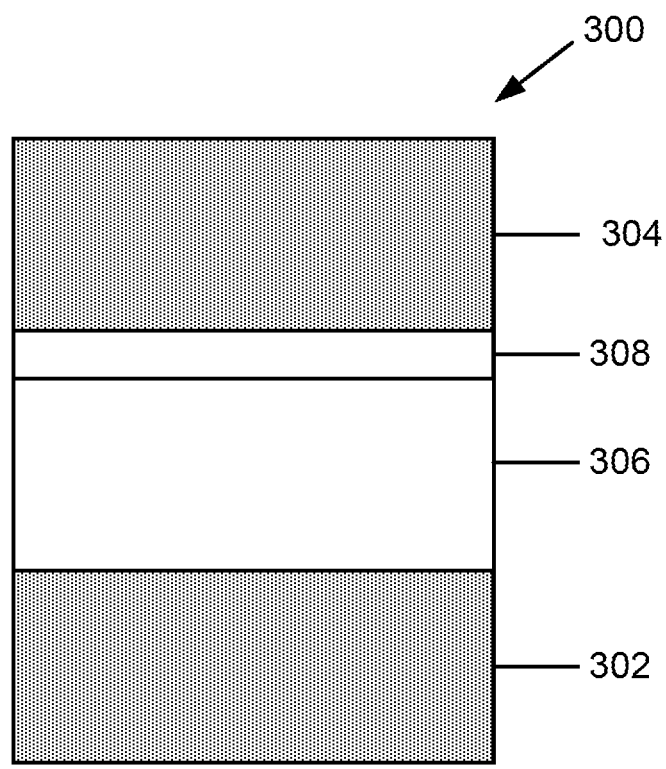
FIG. 3 is a simplified diagram illustrating a resistive switching device according to an embodiment of the present invention.

Referring to FIG. 3, a non-volatile switching device structure 300 according to an embodiment of the present invention is provided. The device includes, a semiconductor substrate 312 having one or more transistors 314 formed therein, a dielectric layer 316, a first electrode 302, a, second electrode 304 and a switching material 306. As shown, the device includes a dielectric layer 308 disposed between the top electrode and the switching material in a specific embodiment. The dielectric material can be a common dielectric material used in CMOS processing such as silicon oxide, silicon nitride, silicon oxynitride, hafnium oxide, aluminum oxide, and others. The dielectric material is preferably characterized by a thickness less than about 10 nm and can be about 5 nm to 10 nm in a specific embodiment. The switching material comprises an amorphous silicon material in a specific embodiment. The second electrode has a first portion that includes a metal material in contact with the dielectric layer in a specific embodiment. The metal material can be a silver material in a specific implementation. Other metal materials can also be used. These other metal materials can include platinum, palladium, nickel, aluminum, and others. The metal material is preferably characterized by a suitable diffusivity in the amorphous silicon material. The second electrode further includes a second portion for a wiring structure for the non-volatile switching device in a specific embodiment. The first electrode can include a conductive material such as copper, aluminum, or tungsten and can further include a diffusion barrier material or an adhesion material 318 depending on the application.

In a certain embodiments, the non-volatile switching device can include a buffer layer 310 disposed in between the first electrode and the switching material. The buffer layer 310 is provided to control interfacial characteristic between the switching material and the bottom electrode. In other embodiments, this buffer layer 310 may not be needed. For an amorphous silicon switching material, a p+ polysilicon material is found to be a suitable buffer layer. The polysilicon material also has an advantage of a common material used in conventional CMOS fabrication.

Figure 4:
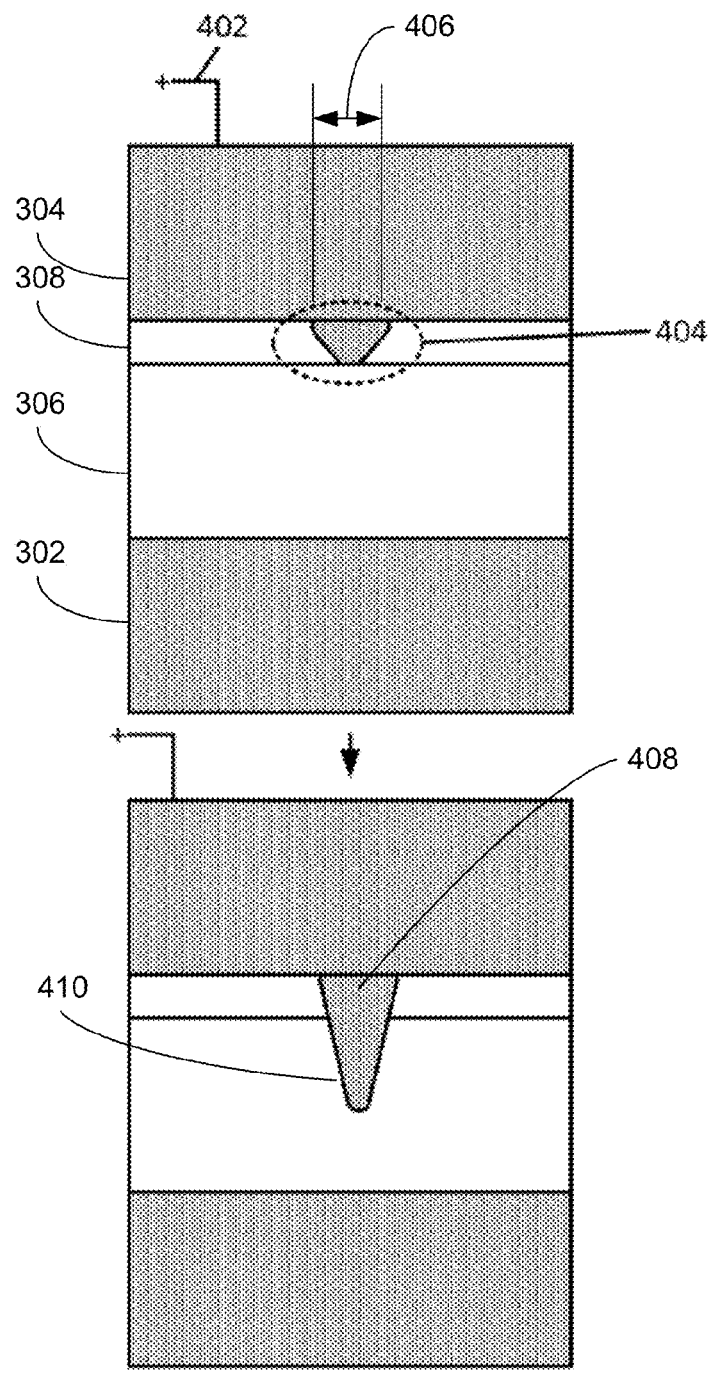
FIG. 4 is a simplified diagram illustrating an operation step of the resistive switching device according to an embodiment of the present invention.
Figure 5:
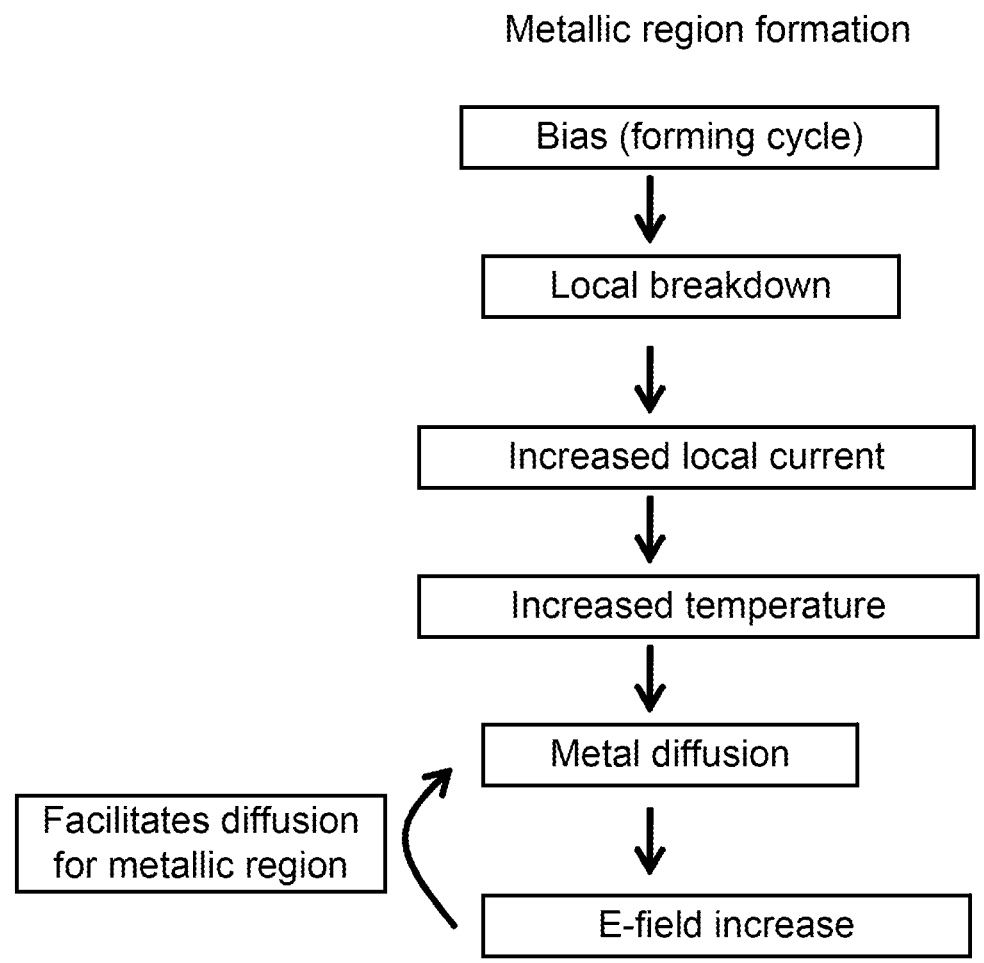
FIG. 5 is a simplified flow diagram illustrating the operation step in FIG. 4 of the resistive switching device according to an embodiment of the present invention.
Figure 6B:
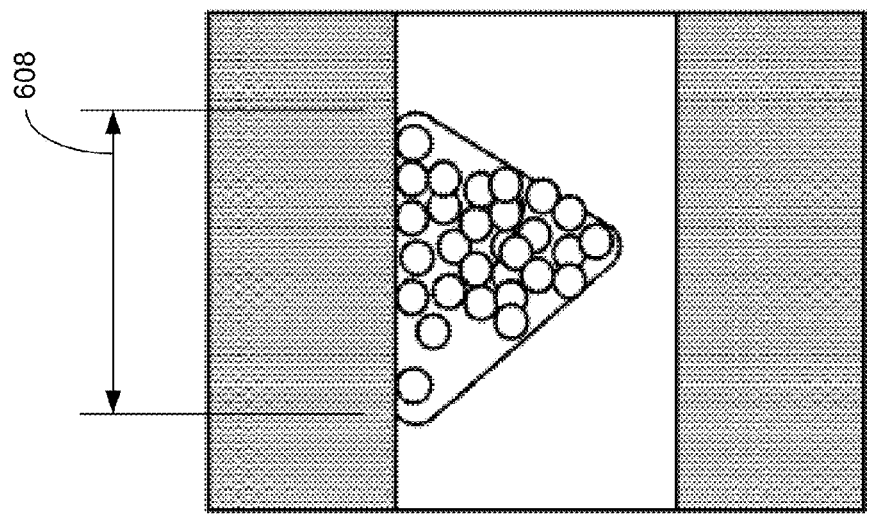
FIG. 6 illustrates a comparison of switching behaviors of the conventional resistive switching device and present inventive switching device.
Figure 6A:
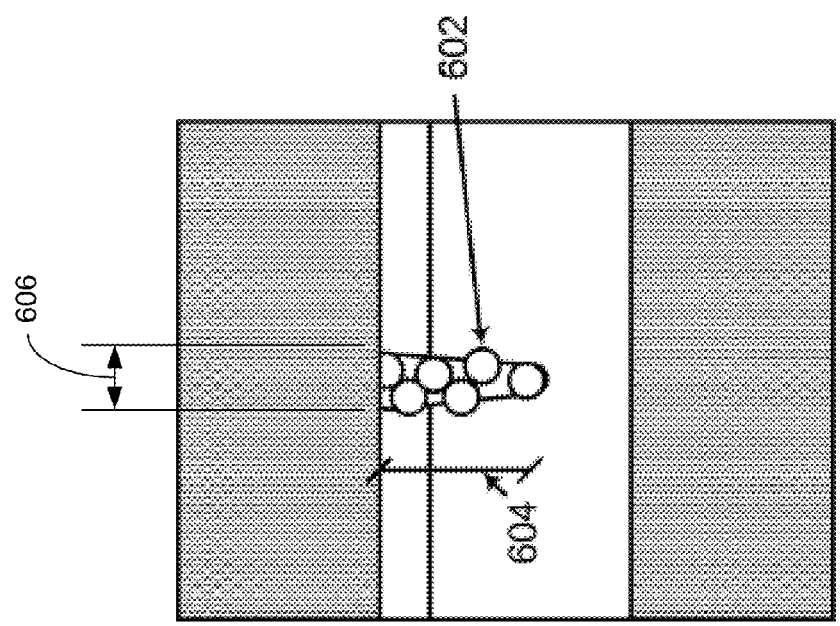

FIGS. 4 and 6($a$) are simplified diagrams illustrating operations and switching characteristics of non-volatile switching device 300 according to embodiments of the present invention. As shown in FIG. 4, the as fabricated switching device is subjected to an electroforming process. The electroforming process includes applying a positive voltage 402 between the second electrode 304 and first electrode 302 to cause a metal region 408 to form in a portion 410 of the switching material and to change a resistance of the switching material. The electroforming forming voltage can range from about 4 volts to about 6 volts for an amorphous silicon switching material and silver as the conductive material. The electroforming voltage initially causes a local electric breakdown in the dielectric layer 308 and forms an opening region 404 in dielectric layer 308 as shown. In a specific embodiment, the opening region can have a first lateral dimension 406 ranging from about 10 nm to about 50 nm depending on the thickness of the dielectric layer 308 and the electroforming voltage applied. The local breakdown of the dielectric layer 308 causes an increase in current density in the opening region and further causes an increase in temperature locally, in vicinity of the opening region. This increase in temperature enhances diffusion of metal through the opening region and an increase in electric field in a vicinity of the opening region. The increase in electric field is also accelerated due to a small metal region formed from the opening region. A summary of the mechanism of metal region formation is illustrated in FIG. 5. The opening region limits the dimension of the metal region formed in the switching material in a specific embodiment. In a specific embodiment, the metal region has a size that is about the same as the opening region. This reduced dimension of metal region allows for further scale down of the switching device in a specific embodiment.

As shown in FIG. 6($a$), the onset of metal region 602 formation starts in the opening region in the dielectric layer. The reduced lateral dimension or diameter 606 of the metal region enables an enhanced electric field in the switching material in a vicinity, of the opening region causing a higher growth rate for the metal region. The opening region also limits the amount of metal particles formed in the switching material allowing for a metal region having a shorter length 604 to form in a specific embodiment.

In contrast to FIG. 6($a$), the conventional switching device without the interposing dielectric layer and having an increased lateral dimension or diameter 608 of a metal region is illustrated in FIG. 6($b$). As the volume of the metal region is relatively large in the conventional switching device absent of the dielectric layer, the number of metal particles is a lot higher. An expansion of the metal region towards the first electrode has to occur to have large enough electric field for the filament structure to form. In this process, the metal region may be in contact with the bottom electrode and shorting the electrodes, resulting in device failure even during the electroforming process. Accordingly, enhanced electric field from a smaller metal region accelerates the growth of the metal region and the filament structure. Growth of the metal region or the filament structure resulting from diffusion is therefore suppressed.

Figure 7B:
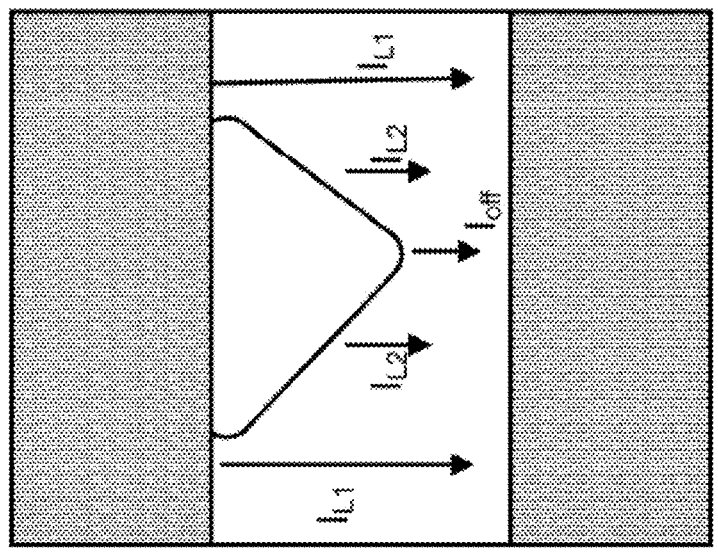
FIG. 7 illustrates a comparison of off state currents of the conventional resistive switching device and present inventive resistive switching device.
Figure 7A:
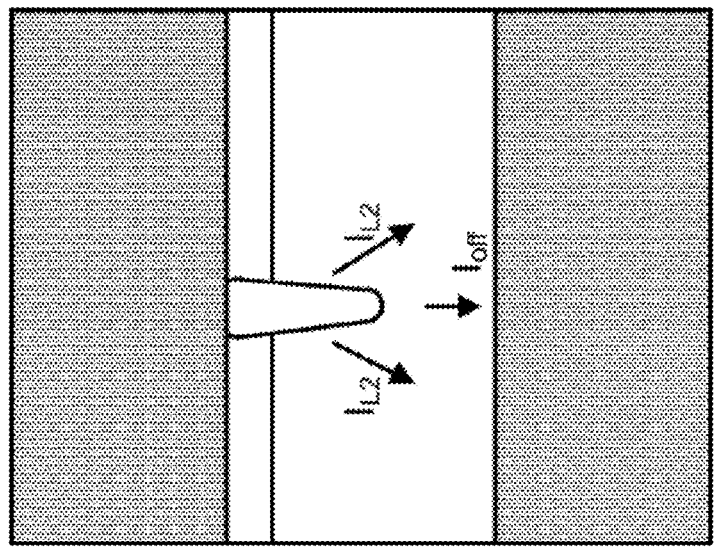

Referring again to FIG. 6($a$), as the filament structure is shorter in the resistive switching device, extension of the filament structure in the amorphous silicon material would not be as much and less likely to reach the bottom electrode for a same operating voltage in a specific embodiment. This improves endurance for repeated operation cycling in a specific embodiment FIG. 7($a$) and FIG. 7($b$) compare off state currents for a resistive switching device having the dielectric layer and a conventional resistive switching device. As shown in FIG. 7($b$), as the metal region is much greater in volume in conventional switching device, leakage current 710 at off state is large as there are more leakage current paths (compared to leakage current 700), for example, IL2 from the metal region to the bottom electrode and IL1 from the second electrode to the first electrode in addition to an off-state current path Ioff from the metal region or the filament structure to the first electrode. As the dielectric material has a much larger energy bandgap than the second electrode material, leakage current from the second electrode to the first electrode is largely suppressed.

Figure 8:
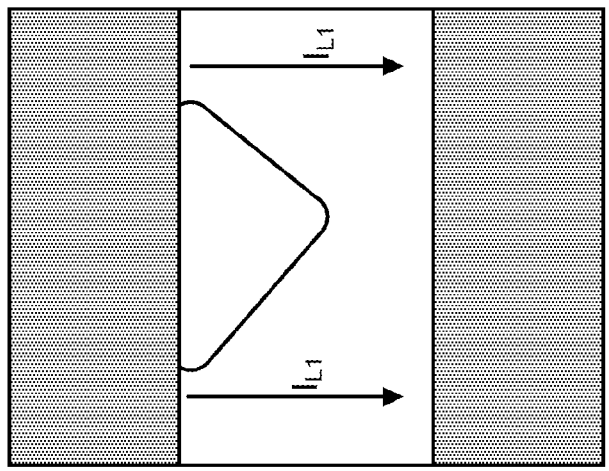
FIG. 8 is a simplified energy bandgap representation of the conventional resistive switching device.
Figure 8:
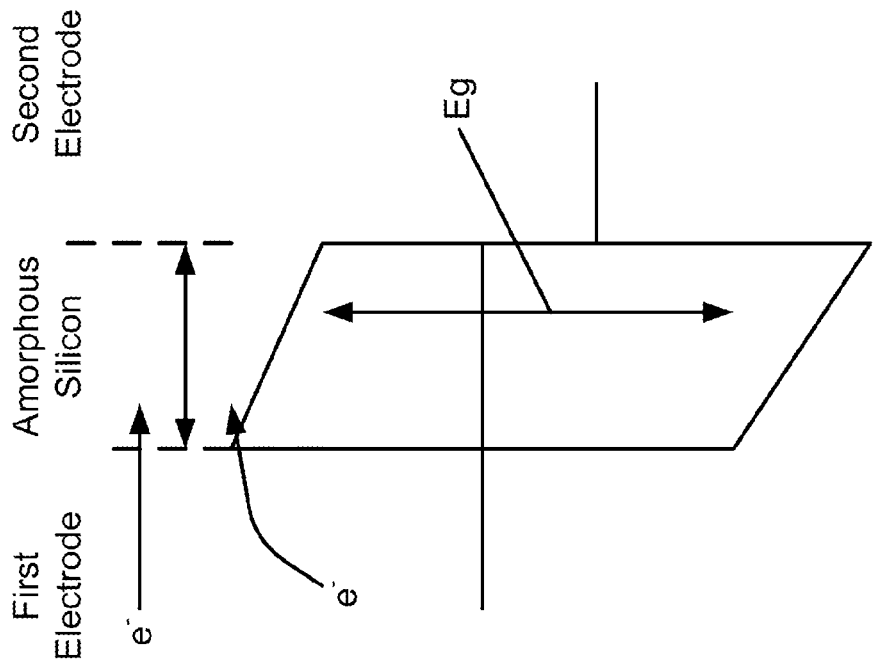

FIG. 8 illustrates an energy bandgap diagram of a conventional switching device structure. The energy bandgap Eg of amorphous silicon material is about 1.7 eV. Electrons from the first electrode can gain enough energy to overcome the energy barrier under just a slight positive bias applied to the second electrode and cause leakage current to flow from the second electrode to the first electrode at least through leakage current paths $I_{L1}$ as shown.

Figure 9:
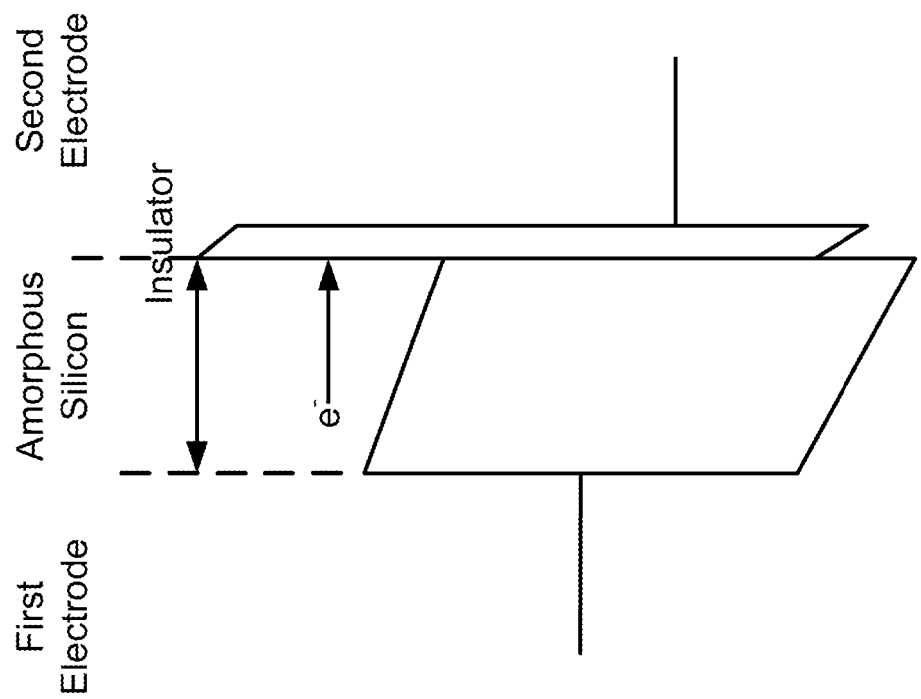
FIG. 9 is a simplified energy bandgap representation of the resistive switching device according to an embodiment of the present invention.
Figure 9:
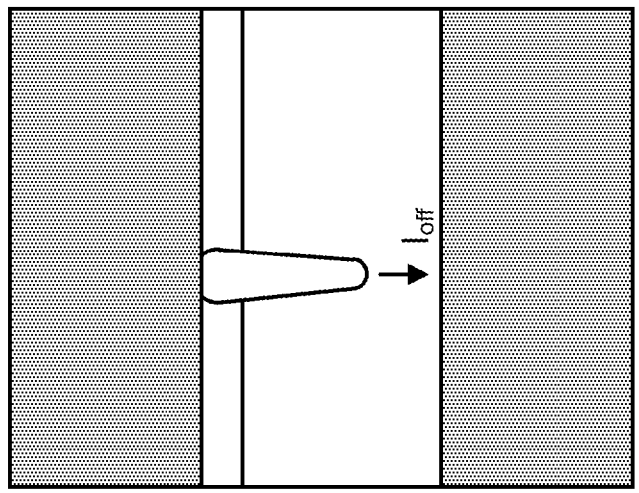

Referring now to FIG. 9. A dielectric material or an insulator material has a much higher bandgap than an amorphous silicon material. For example, silicon dioxide has a bandgap of about 9 eV. Leakage currents flowing from the second electrode to the first electrode are effectively blocked by the dielectric layer except along the conductive path comprising the metal region and the filament as shown in FIG. 9. In a specific embodiment, the dielectric material layer has a thickness of less than about 10 nm to allow breakdown at a reasonable low voltage allowing the filament structure to form in the switching material. At a read voltage of about 0.5 volt to 1.0 volt, electron tunneling through the dielectric layer of thickness between 5 nm and 10 nm is insignificant, that is, leakage current flowing from the second electrode to the first electrode is greatly suppressed, or non-existent.

Figure 10:
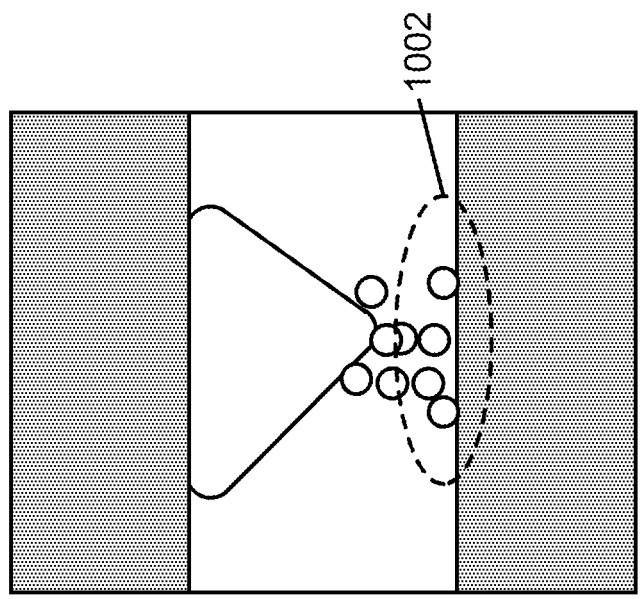
FIG. 10 is a simplified diagram of an interfacial property of the conventional resistive switching device.

Referring to FIG. 10, as the metal particles are formed in defect sites of the amorphous silicon material, a high density of defect sites in amorphous silicon material would form a high density of metal particles. Due to material mismatch, the number of defect sites in an interface region 1002 formed from the amorphous silicon material and the first electrode material is high. A high number of metal particles are trapped in the interface region and causes electrical connection between the top electrode and the bottom electrode and device failure. A buffer layer is usually provided in between the amorphous silicon material and the bottom electrode to prevent excessive metal particles to form. The buffer layer would have to be engineered to have a desirable characteristic to allow for proper switching of the device. That is the buffer layer needs to have a suitable thickness and a suitable conductivity, which can be different for a different thickness and defect characteristics of the amorphous silicon material. This results in a narrow process window for device fabrication.

Figure 11:
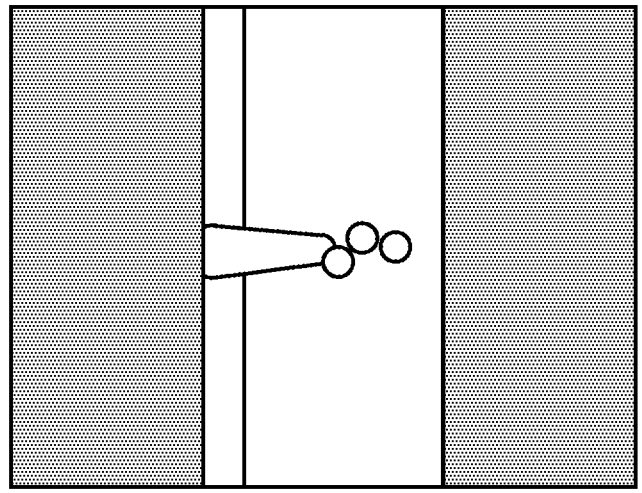
FIG. 11 is a simplified diagram exemplifying an interfacial property of the resistive switching device according to an embodiment of the present invention.

When the metal region is restricted to a small region as shown in FIG. 11 according to embodiments of the present invention, the number of metal particles formed in filament structure is also limited. As operating voltages (read write, or erase) are lower than the electroforming voltage, the metal region would not expand under operation condition and only the filament structure expands or retracts. The filament structure can thus be better controlled. Under such condition, no metal particles are directly formed on the first electrode and a buffer layer may not be necessary, which enable a simpler device design and fabrication.

Additionally, in the presence of the dielectric layer between the second electrode and the amorphous silicon material, the metal region formed in the amorphous silicon material is reduced. Only a small amount of metal material is required to present in the second electrode for the purpose of changing the resistance of the amorphous silicon material. The dielectric layer interposed between the second electrode and the amorphous silicon material thus provides a mechanism for a small metal region to form. Moreover, certain metal material used, for example, silver, may not be commonly used in CMOS processing. Silver processing may not be entirely compatible with present semiconductor device fabrication. Therefore a smaller amount of silver used would cause less contamination, for example, during second electrode etch.

In a specific embodiment, a method of forming a non-volatile memory device may be summarized as follows:

1. providing a semiconductor substrate having a surface region, the semiconductor substrate can be a single crystal silicon, a silicon germanium material, or a silicon on insulator (SOI) substrate, the semiconductor substrate comprises one or more transistor devices for controlling circuitry for the device;

2. forming a first dielectric material overlying the surface region of the semiconductor substrate, the first dielectric material comprises a silicon oxide, a silicon nitride, a low K dielectric, a high K dielectric, or a silicon oxide on silicon nitride on silicon oxide stack;

3. forming a first electrode structure overlying the dielectric material, the first electrode structure can be tungsten, copper, aluminum, or other suitable conductive material, including a combination.

2. forming a resistive switching material comprising an amorphous silicon material overlying the first electrode structure;

3. forming a thickness of second dielectric material having a thickness of about 5 nm or less overlying the resistive switching layer, the thickness of second dielectric material is selected from: silicon dioxide, silicon nitride, hafnium oxide, aerogel, and aluminum oxide, the thickness of second dielectric material can be formed using techniques such as chemical vapor deposition (including low pressure chemical vapor deposition, plasma enhanced chemical vapor deposition, and others), the thickness of second dielectric material is caused to electrically breakdown in a localized region upon application of an electroforming voltage to form an opening region in a portion of the thickness of second dielectric material; and 4. forming a second electrode comprising at least a metal material overlying the resistive switching material; the metal material can be silver, platinum, palladium or nickel, or a combination thereof, the second electrode further comprises a portion for a wiring material selected from tungsten, copper, and aluminum.

The above sequence provides a method for forming a non-volatile resistive switching device according to an embodiment of the present invention. Depending on the applications, one or more steps may be added, one or more steps may be omitted, one or more steps may be provided in a different sequence. One skilled in the art would recognize other variations, modifications, and alternatives.

Though the present invention has been described using various examples and embodiments, it is also understood that the examples and embodiments described herein are for illustrative purposes only and that various modifications or alternatives in light thereof will be suggested to persons skilled in the art and are to be included within the spirit and purview of this application and scope of the appended claims.

What is claimed is:

1. A non-volatile memory device comprising:
a first electrode;
a second electrode comprising a metal material;
a resistive switching material comprising an amorphous silicon material overlying the first electrode; and
a dielectric material formed between the second electrode and the resistive switching layer, wherein the dielectric material initially completely separates the second electrode and the resistive switching layer, wherein the dielectric material has a thickness configured to electrically breakdown in a region when a first voltage is applied to the second electrode, and wherein the region allows a first metal region characterized by a first diameter to form therein and extend in a portion of the resistive switching material from the metal material.

2. The device of claim 1 wherein the dielectric material is selected from a group consisting of: silicon nitride, hafnium oxide, aerogel, and aluminum oxide.

3. The device of claim 1 wherein the dielectric material is formed by a process selected from a group consisting of: a plasma enhanced chemical vapor deposition process, an atomic layer deposition process, a spin coating process, a plasma process, or a physical vapor deposition process.

4. The device of claim 1 wherein the thickness of the dielectric material has a non-zero thickness of selected from a range of about 5 nm to about 10 nm.

5. The device of claim 1 wherein the first voltage is a positive bias applied to the second electrode.

6. The device of claim 1 wherein the first diameter is less than about 10 nm.

7. The device of claim 1 wherein a region in the resistive switching material allows a second metal region characterized by a second diameter to form therein from the metal material absent of the dielectric material; and wherein the first diameter is less than a second diameter.

8. The device of claim 1 wherein the dielectric material comprises a silicon oxide.

9. The device of claim 1 wherein the metal material is in contact with the dielectric material.

10. The device of claim 1 wherein the metal material is selected from a group of materials consisting of: silver, platinum, palladium, copper or nickel.

11. The device of claim 1 wherein the second electrode structure further comprises a portion for a wiring material selected from a group consisting of: tungsten, copper, aluminum.

12. The device of claim 1 wherein upon application of the first voltage within a range of about 4 volts to about 6 volts, an increase in local current density and an increase in temperature in the first metal region occurs in the region of the dielectric material.

13. The device of claim 12 wherein the metal material diffuses into the resistive switching material in response to the increase in temperature.

14. The device of claim 1 further characterized by a first leakage current at an off state, wherein the first leakage current is lower that a second leakage current associated with the device in absence of the dielectric layer.

15. The device of claim 1 wherein the first metal region further comprises a filament structure extending towards the first electrode upon application of a second voltage.

16. The device of claim 15 wherein the filament structure is characterized by a length dependent substantially upon a polarity and an amplitude of the second voltage and substantially independent from a diffusion characteristic of the metal material in the resistive switching material.

17. The device of claim 1
wherein the second electrode also comprises a diffusion barrier material; and
wherein the diffusion barrier material is disposed between the metal material and the dielectric material.

18. The device of claim 1
wherein the first electrode comprises a metal layer and a buffer material;
wherein the buffer material is disposed between the metal layer and the resistive switching material; and
wherein the buffer material comprises a p-doped silicon bearing layer.

19. The device of claim 18 wherein the buffer material comprises a p+ doped polysilicon material.

20. The device of claim 1 further comprising one or more transistor devices coupled to the first electrode.

* * * * *